United States Patent
Sheperek et al.

(10) Patent No.: US 11,573,720 B2
(45) Date of Patent: Feb. 7, 2023

(54) OPEN BLOCK FAMILY DURATION LIMITED BY TIME AND TEMPERATURE

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US); Steven Michael Kientz, Westminster, CO (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 16/947,819

(22) Filed: Aug. 19, 2020

(65) Prior Publication Data

US 2022/0057934 A1    Feb. 24, 2022

(51) Int. Cl.
*G06F 3/06* (2006.01)
*G01K 3/04* (2006.01)
*G06F 1/324* (2019.01)
*G06F 1/3228* (2019.01)

(52) U.S. Cl.
CPC ............. *G06F 3/064* (2013.01); *G01K 3/04* (2013.01); *G06F 1/324* (2013.01); *G06F 1/3228* (2013.01); *G06F 3/0604* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 4,866,713 A * | 9/1989 | Worger | G06F 11/10 714/25 |
| 9,905,302 B2 * | 2/2018 | Karakulak | G11C 11/5642 |
| 11,210,031 B1 * | 12/2021 | Mekhanik | G06F 3/0679 |
| 2005/0251622 A1 * | 11/2005 | Arimilli | G06F 9/3824 712/E9.046 |
| 2013/0145079 A1 * | 6/2013 | Lee | G06F 12/0246 711/E12.008 |

(Continued)

FOREIGN PATENT DOCUMENTS

CN    103389644 A * 11/2013

*Primary Examiner* — Sanjiv Shah
*Assistant Examiner* — Elias Young Kim
(74) *Attorney, Agent, or Firm* — Lowenstein Sandler LLP

(57) ABSTRACT

A includes a memory device and a processing device, operatively coupled to the memory device. The processing device is to: initialize a block family associated with the memory device; initialize a timer at initialization of the block family; and aggregate temperature values received from sensor(s) of the memory device over time to generate an aggregate temperature. Responsive to programming a page residing on the memory device, the processing device associates the page with the block family. The processing device closes the block family in response to the aggregate temperature being greater than a first temperature value and the timer reaching a first time value. The processing device closes the block family in response to the aggregate temperature being less than or equal to the first temperature value and the timer reaching a second time value that is greater than the first time value.

20 Claims, 12 Drawing Sheets

(56) References Cited

U.S. PATENT DOCUMENTS

| | | | | |
|---|---|---|---|---|
| 2015/0364190 | A1* | 12/2015 | Au | G11C 13/0033 |
| | | | | 365/222 |
| 2016/0314847 | A1* | 10/2016 | Yang | G11C 29/52 |
| 2017/0255403 | A1* | 9/2017 | Sharon | G11C 16/3431 |
| 2017/0271031 | A1* | 9/2017 | Sharon | G06F 11/3058 |
| 2017/0345489 | A1* | 11/2017 | Zeng | G11C 29/028 |
| 2019/0354314 | A1* | 11/2019 | Hung | G06F 3/0659 |
| 2020/0242025 | A1* | 7/2020 | Du | G06F 12/0882 |
| 2020/0279610 | A1* | 9/2020 | Chang | G11C 11/40603 |

* cited by examiner

OPEN BLOCK FAMILY DURATION LIMITED BY TIME AND TEMPERATURE

TECHNICAL FIELD

Embodiments of the disclosure are generally related to memory sub-systems, and more specifically, are related to open block family duration limited by time and temperature.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
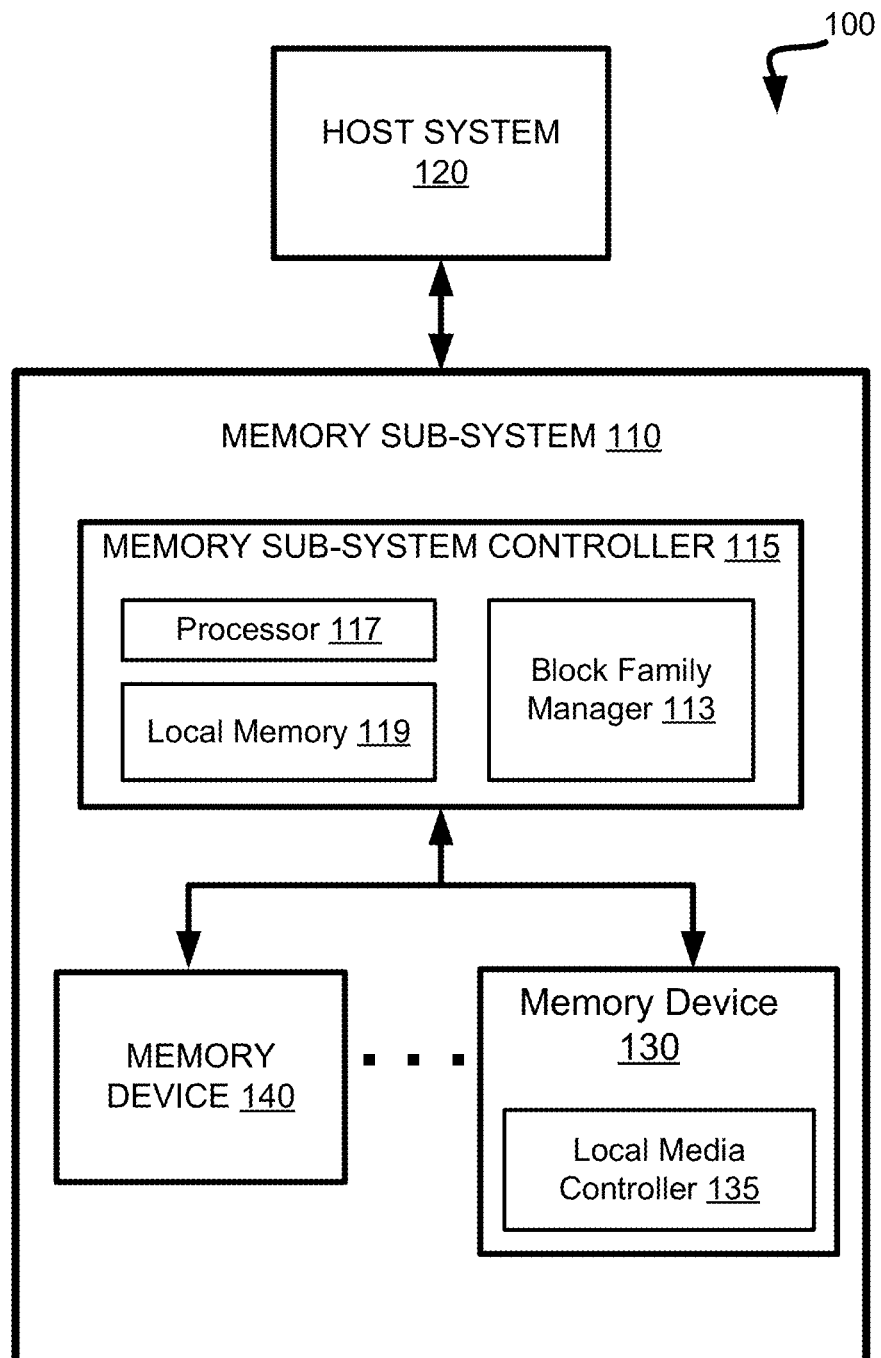
FIG. 1 illustrates an example computing system that includes a memory sub-system in accordance with some embodiments.

Embodiments of the present disclosure are directed to determining open block family duration based on time and temperature. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), block family information, and the like.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (TVS), since the degrading electric charge causes the voltage distributions to shift along the voltage axis towards lower voltage levels. The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

According to various embodiments, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In various embodiments, the time window can vary depending on an aggregate temperature associated with the block family, over time, while the block family is opened. Upon meeting certain criteria, such as passage of a particular amount of time at a certain aggregate temperature, the block family can be closed. After closure of one block family, further programming to dice of the memory device is to a newly opened block family. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family. This specified period of time can vary, however, depending on an aggregate temperature associated with the new block family (e.g., within one or more dice of the memory device) or depending on an actual measurement of temporal voltage shift of one or more memory cells of the block family. Further, if the memory sub-system is powered off while a block family is still open, the memory sub-system controller can estimate, upon power on of the memory sub-system, a power off period with which to update a timer used to track time to close the block family. The memory sub-system controller can maintain an identifier of the active block family, which is associated with the memory cells as they are being programmed.

The memory sub-system controller can periodically perform a calibration process in order to associate each die of every block family with one of the predefined threshold voltage offset bins, which is in turn associated with the voltage offset to be applied for read operations. The associations of pages or blocks with block families and block families and dies with threshold voltage offset bins can be stored in respective metadata tables maintained by the memory sub-system controller.

Upon receiving a read command, the memory sub-system controller can identify the block family associated with the page or block identified by the logical block address (LBA) specified by the read command, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage.

Therefore, advantages of the systems and methods implemented in accordance with some embodiments of the present disclosure include, but are not limited to, improving the bit error rate in read operations by maintaining metadata tracking groups of memory cells (as block families) that are presumed to exhibit similar voltage distributions and selectively performing calibration operations for limited subsets of memory cells based on their block family association. Further, because such tracking, storage, and calibration are performed on a block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager component 113 is part of the host system 120, an application, or an operating system. The block family manager 113 can manage block families associated with the memory devices 130, as described in more detail herein below.

Figure 2:
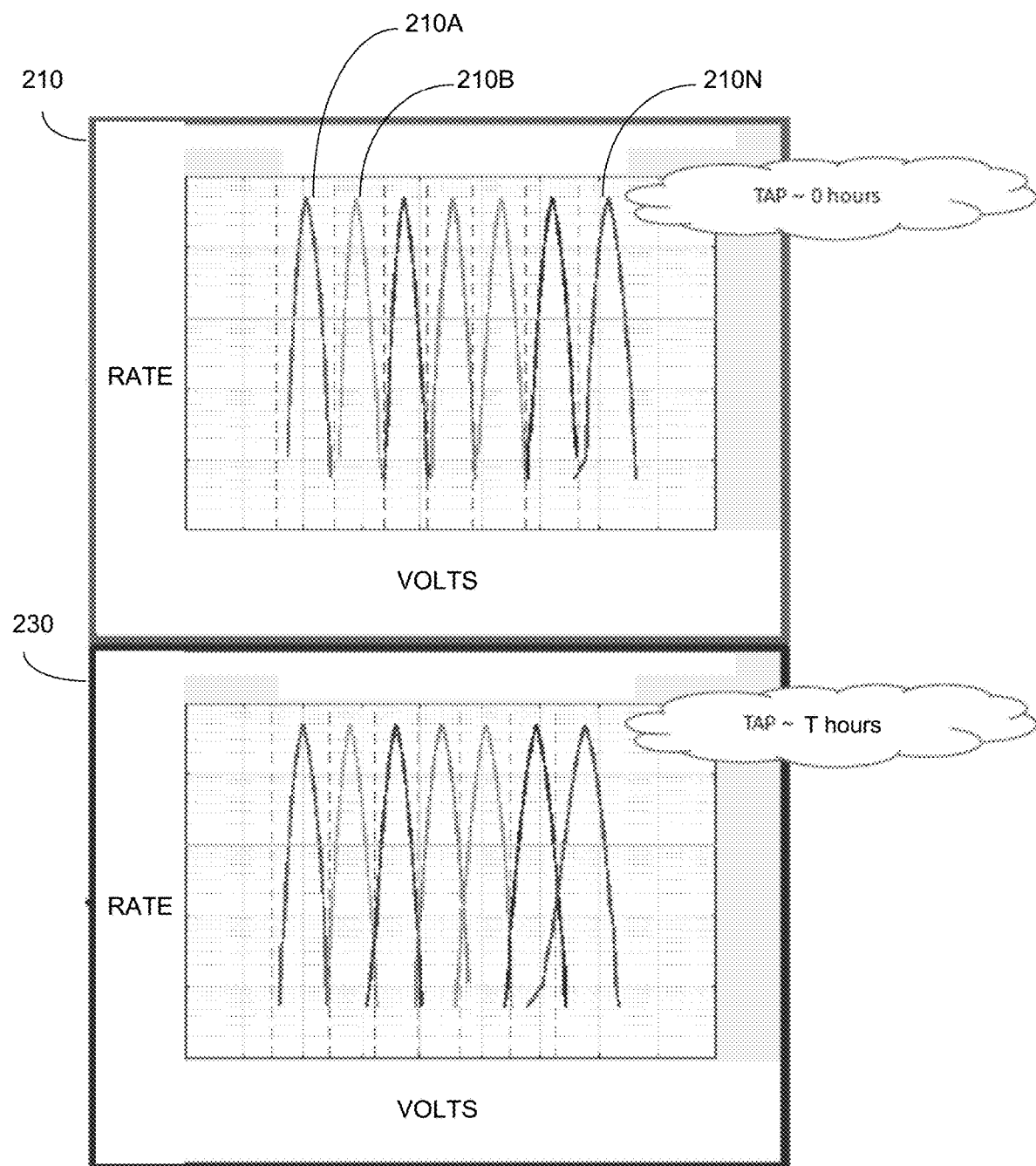
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions change in time due to the slow charge loss, which results in drifting values of the threshold voltage levels (shown by dashed vertical lines). In various embodiments, this temporal voltage shift (TVS) is selectively tracked for programmed pages or blocks grouped by block families, and appropriate voltage offsets, which are based on page or block affiliation with a certain block family, are applied to the base read levels in order to perform read operations.

Figure 3:
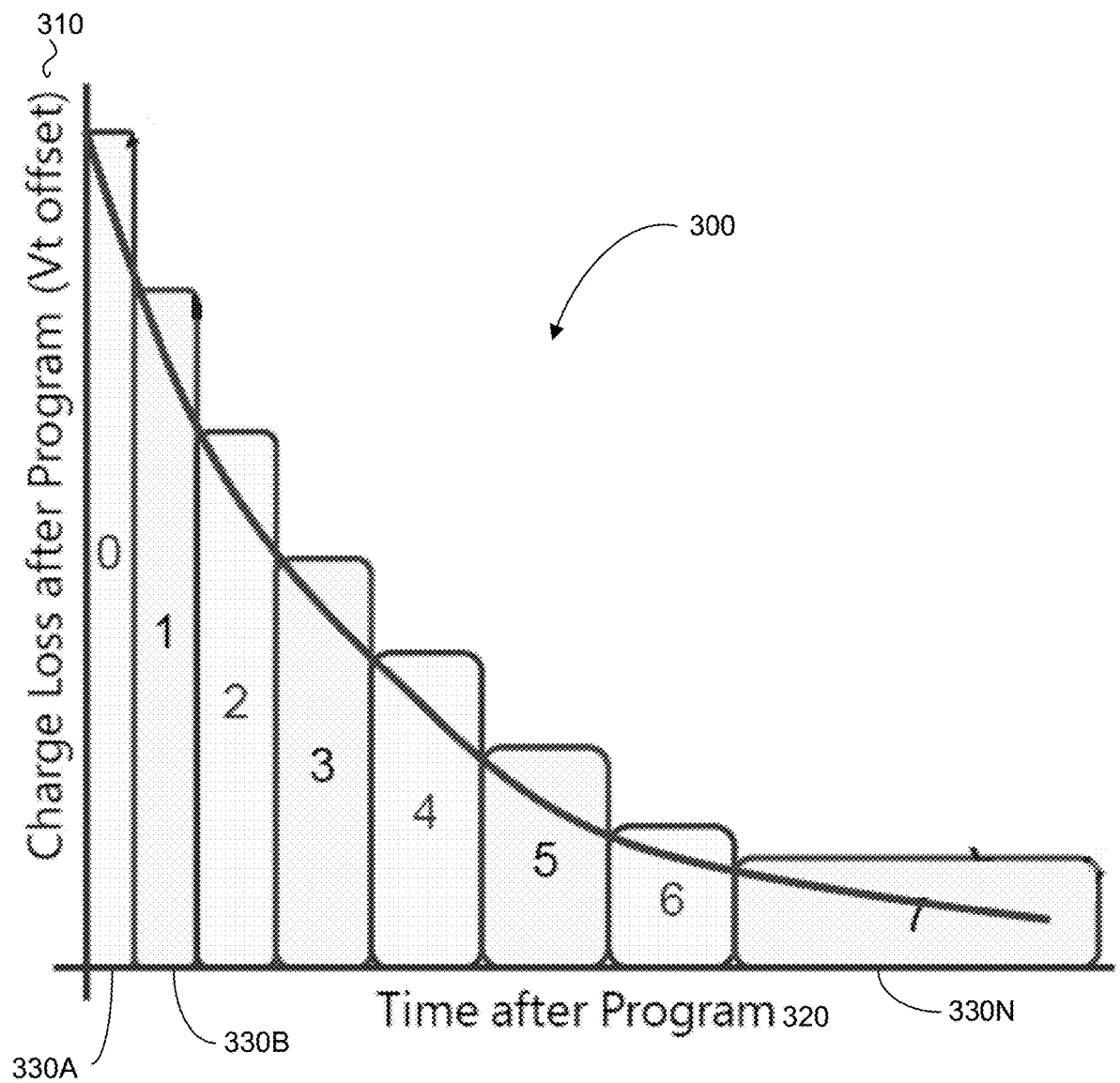
FIG. 3 is an example graph illustrating the dependency of a threshold voltage offset on the time after program, e.g., the period of time elapsed since a page had been programmed, in accordance with some embodiments.
Figure 4:
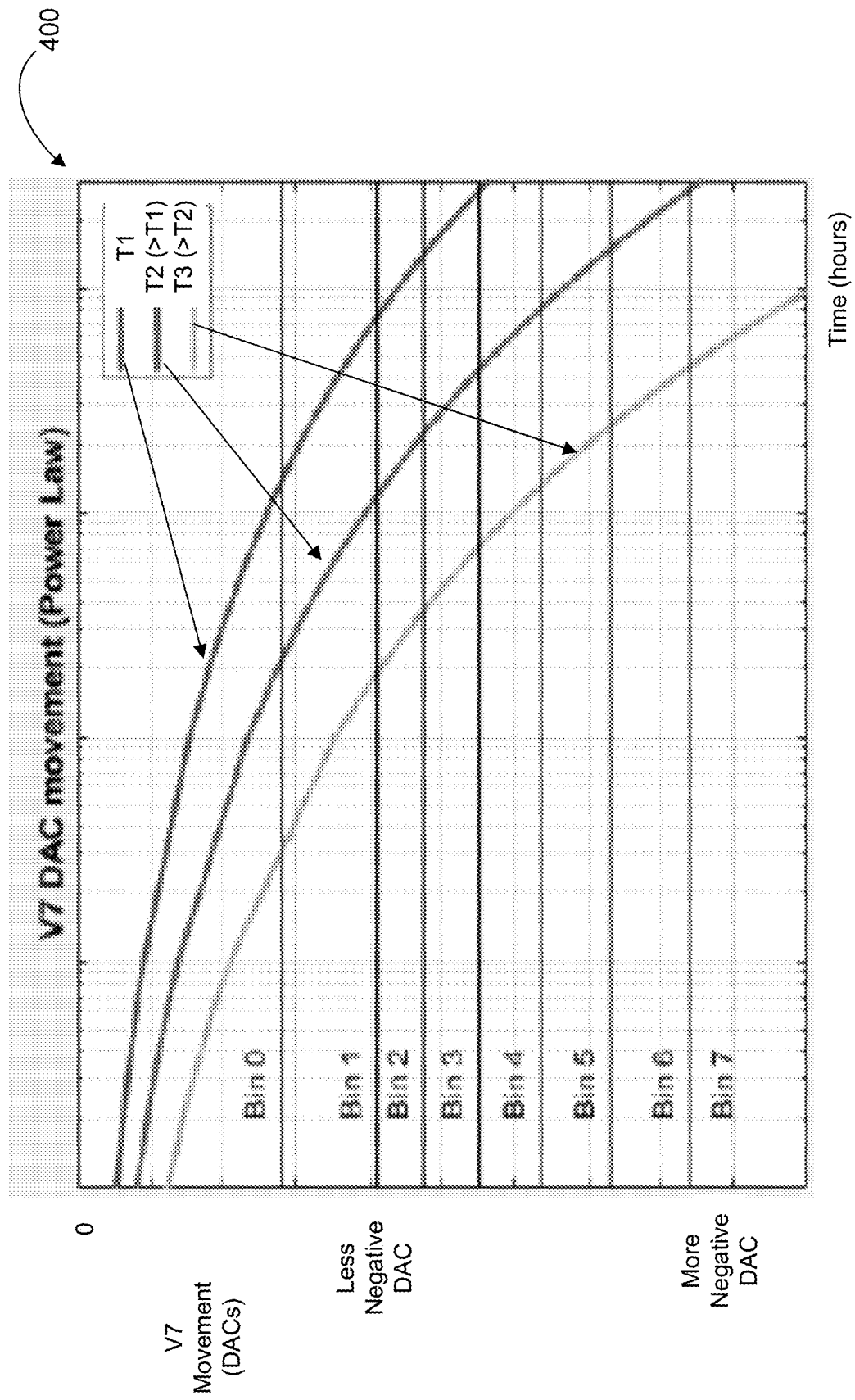
FIG. 4 is an example graph illustrating the dependency of the threshold voltage offset on both time after program and aggregate temperature, in accordance with some embodiments.

FIG. 3 is an example graph 300 illustrating the dependency of a threshold voltage offset 310 on the time after program 320, e.g., the period of time elapsed since a page had been programmed, in accordance with some embodiments. FIG. 4 is an example graph 400 illustrating the dependency of the threshold voltage offset on both time after program (TAP) and aggregate (e.g., average) temperature, in accordance with some embodiments. As schematically illustrated by FIG. 3, pages or blocks (or groups of memory cells at another granularity) of the memory device are grouped into block families 330A-330N, such that each block family includes one or more pages or blocks that have been programmed within a specified time window, potentially varied by aggregate temperature while the block family is open (FIG. 4). As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an aggregate temperature associated with pages during programming. More specifically, the entire asymptotic curve illustrated in FIG. 3 can be shifted to have a steeper curve with respect to time, as illustrated in FIG. 4, as aggregate temperature increases. In FIG. 4, the curve associated with T1 decreases with time at a much slower rate (e.g., about 100 times slower) compared to the curve associated with T3. The curves in FIG. 4 look differently from the curve in FIG. 3 due to being graphed at log 10 scale in order to illustrate the difference in slow charge loss as temperature varies. Slow charge loss is illustrated along the vertical access for the seventh valley (V7) based on digital-to-analog (DAC) converted voltage values, also referred to as DACs. Each DAC can represent a certain number of millivolts (mV), here about 10 mV.

A newly created block family can be associated with bin 0, and each subsequently created block family can be associated with a sequentially numbered block family. Then, the memory sub-system controller can periodically perform a calibration process in order to associate each die of every block family with one of the predefines threshold voltage offset bins (e.g., bins 0-7 in the illustrative example of FIG. 3), which is in turn associated with the voltage offset to be applied for read operations. The associations of pages, blocks, and/or partitions with block families and block families and dies with threshold voltage offset bins can be stored in respective metadata tables maintained by the memory sub-system controller 115.

Figure 5:
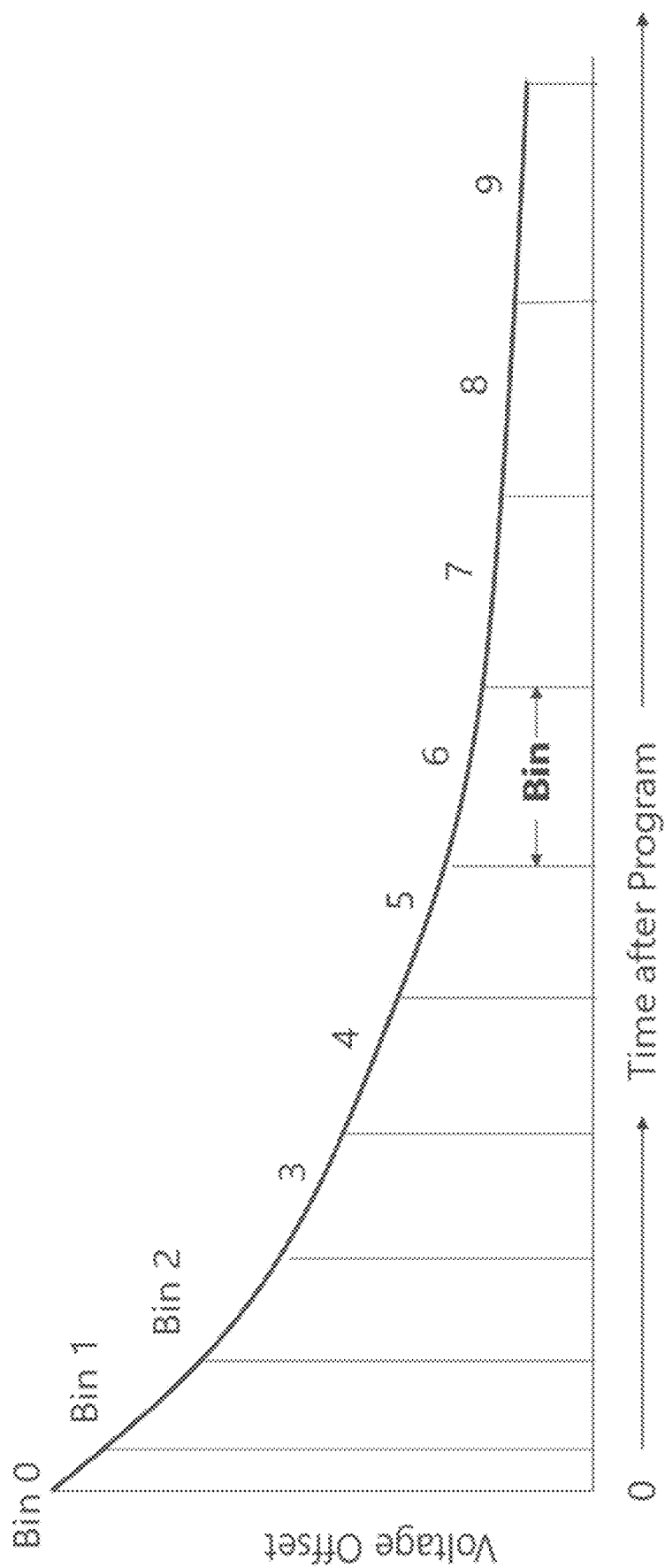
FIG. 5 is a graph that illustrates a set of predefined threshold voltage offset bins, in accordance with embodiments.

FIG. 5 is a graph that illustrates a set of predefined threshold voltage offset bins (bin 0 to bin 9), in accordance with some embodiments. As schematically illustrated by FIG. 5, the threshold voltage offset graph can be subdivided into multiple threshold voltage offset bins, such that each bin corresponds to a predetermined range of threshold voltage offsets. While the illustrative example of FIG. 5 defines ten bins, in other implementations, various other numbers of bins can be employed (e.g., 16, 32, 64 bins). Based on a periodically performed calibration process, the memory sub-system controller 115 can associate each die of every block family with a threshold voltage offset bin, which defines a set of threshold voltage offsets to be applied to the base voltage read level in order to perform read operations.

Figure 6:
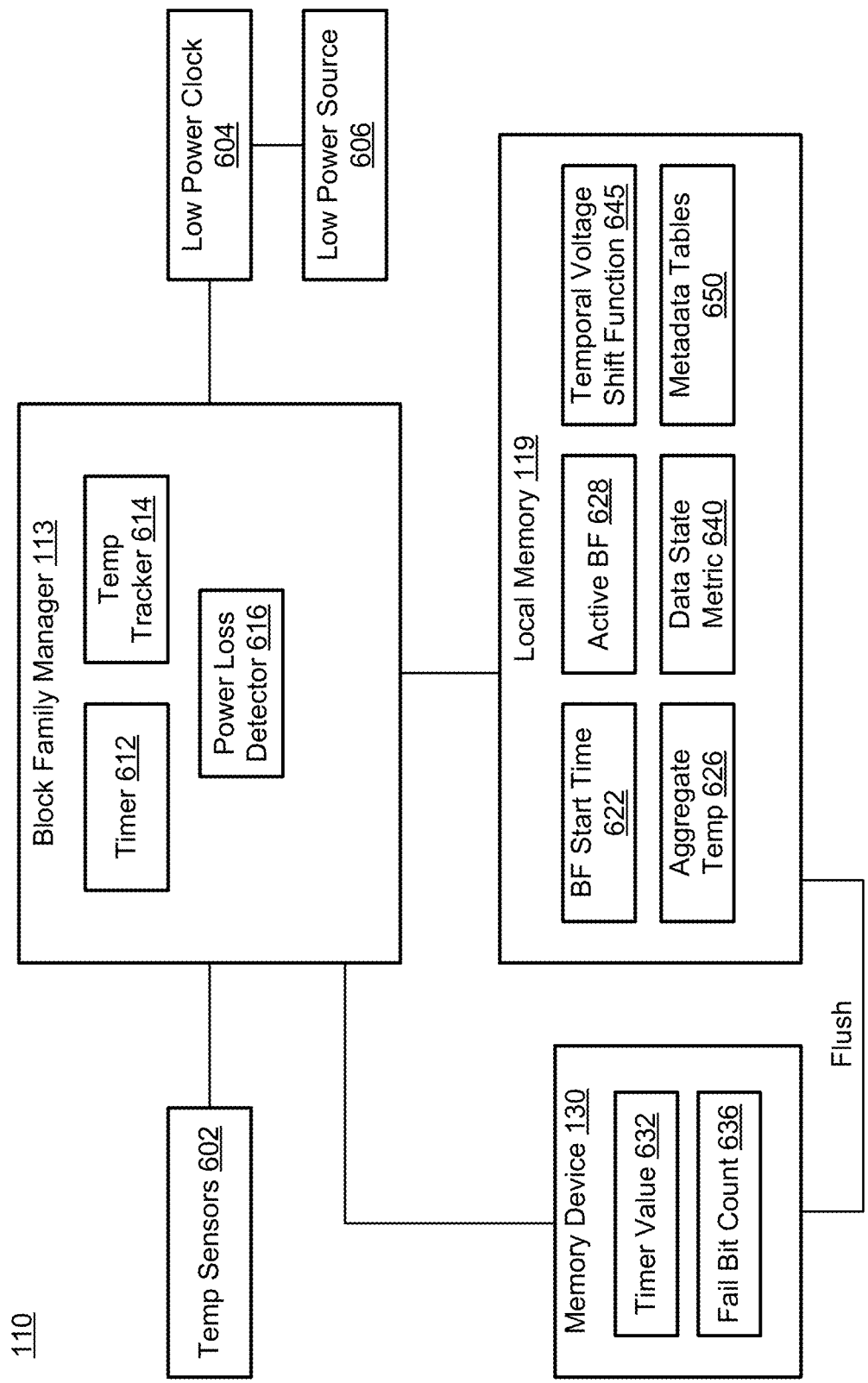
FIG. 6 is a block diagram that illustrates operation of a block family manager within the memory sub-system controller of FIG. 1 in accordance with various embodiments.

FIG. 6 is a block diagram that illustrates operation of the block family manager 113 within the memory sub-system controller 115 of FIG. 1 in accordance with various embodiments. In various embodiment, the memory sub-system can include temperature sensors 602, a low power clock 604 and a low power source 606 to power the low power clock 604. The block family manager 113 can include a timer 612, a temperature tracker 614, and a power loss detector 616, although other functionality of the block family manager 113 will be discussed with reference to managing and tracking block families throughout this disclosure. In alternative embodiments, the timer 612 and/or the power loss detector 616 are located elsewhere in the controller 115, such as within the processor 117, and are accessed for use by the block family manager 113. The local memory 119 can store a number of different items of information or data that will be discussed in more detail, including but not limited to, a block family (BF) start time 622, an aggregate temperature 626, an active block family (BF) identifier 628, a data state metric 640, a temporal shift function 645, and a set of metadata tables 650.

More specifically, in various embodiments, the block family manager 113 can open a new block family after a previously block family has been closed. At initiation of the block family, the block family manger 113 can initialize the timer 612 associated with a system clock. The system clock, for example, can be a clock maintained by the memory sub-system 110 and/or the host system 120. The time at which the block family is opened on the system clock can be stored as the BF start time 622.

As time passes while the controller 115 programs the BF of the memory device 130, the block family manager 113 (e.g., the temperature tracker 614) can continuously aggregate the temperature values received from one or more of the temperature sensors 602 of the memory device 130 or 140, e.g., located at individual die, to generate an aggregate temperature. This aggregate temperature, for example, can be an average, a median, an integration or other similar arithmetic function calculated of the temperature values over time. The temperature tracker 614 can further periodically store the aggregate temperature 626 in memory. In this way, the aggregate temperature is tracked and a history of the aggregate temperature can also be stored. The block family manager 113 can then use the aggregate temperature to determine what time value the timer 612 is to reach before closing the block family, as will be discussed in more detail with reference to FIGS. 7-8. In some embodiments, the temperature sensors 602 can include, in addition to a temperature sensor located at each die of the memory device 130, a temperature sensor located at or coupled to the controller 115 and/or a thermocouple of the memory sub-system 110, which may enable determining a system temperature. The system temperature may be related to or used for the temperature of the memory devices 130 or 140.

In some embodiments, instead of estimating the impact of aggregate temperature on how long a block family is left opened, the block family manager 113 can directly measure the temporal voltage shift (TVS) of a voltage within one or more memory cell of a page in the BF. This measurement can take place after reaching a first time value on the timer 612. If the TVS value is greater than or equal to a threshold TVS value, then block family manager 113 closes the block family. Otherwise, the block family manager 113 can wait a further amount of time on the timer 612 and either again measure the TVS value associated with the block family (to perform a further comparison to the threshold TVS value), or close the block family based on the timer 612 reaching a second time value. The block family manager 113 can determine the second amount of time as a function of how close the measured TVS value is from reaching the threshold TVS value, as a set amount of time, or based on some other estimates based on the measures TVS value. In this way, direct measurement of TVS can function as a proxy for temperature to be used in connection with approximate time periods after which to close the BF. The direct TVS measurement can be seen as more accurate than aggregate temperature because the TVS value of the BF is a direct indication of slow charge loss where aggregate temperature and time estimate the amount of slow charge loss.

The block family currently being programmed can be referred as the active block family for which the active BF identifier 628 can be stored in the local memory 119 and indexed to within the metadata tables 650. For ease of tracking, each subsequently programmed block family can be assigned a sequentially numbered BF identifier, but other sequences and identifiers can also be used.

In some embodiments, slow charge loss can occur even while the memory sub-system 110 is powered off. If the memory sub-system 110 (or corresponding memory device 130) is powered off while a block family is opened, it can be difficult to know how much time has passed for purposes of closing the block family because the system clock has no power. For this reason, the block family manager 113 can track or estimate power off time in order to update the timer 612 upon powering back up. Tracking and estimation of power off time, such as through extrapolating how much time has passed from programming certain data, can enable a close enough approximation to the power off time to effectively time closing the block family.

In various embodiments, the block family manger 113 can employ a power loss detector 616 to detect or receive an indication of imminent power loss of the memory sub-system 110. The block family manager 113 can, in response to such detection or receipt of such indication, store information in the memory device 130 (or other non-volatile memory (NVM)) such as a timer value 632 and a fail bit count 636 associated with the open block family. The block family manager 113 can also flush the contents of the local memory 119 to the memory device 130 (or other NVM) in order to preserve information and data locally stored in the local memory 119. The fail bit count 636 can be a value of measured read bit error rates in the block family.

To track the power off time, the block family manager 113 can perform one of a number of operations. In one embodiment, the block family manager 113 stores, in the memory device 130 (or other NVM), a timer value 632 (of the timer 612) before powering down the system while the block family is still open. The block family manager 113 can further track, using the low-power clock 604, a time period the memory device is powered off. For example, the block family manager 113 can record the time value of the low power clock 604 in response to detecting an imminent power failure. The low-power clock 604 can be, for example, a Real Time Clock that works even when the external power is switched off. The low-power clock 604 can be powered by the low power source 606, such as a complementary metal-oxide-semiconductor (CMOS) battery, or the like, which retains charge without external power.

The block family manager 113 can further detect a power on of the memory sub-system system, and in response, record a second time value of the low power clock 604. The difference between the time value (at power OFF) and the second time value (at power ON) can be the power off time period. The block family manager 113 can then increment the timer value 632, restored from the memory device 130 (or other NVM), by the time period tracked by the low power clock 604, e.g., the power off time period. The timer value 632 that is restored to the timer 612 can then be more accurate having incorporated an estimate of the power off time period.

In another embodiment, the block family manager 113 likewise stores the timer value 632 in the memory device 130 upon detecting an imminent power loss. The block family manager 113 can further, upon powering back on, measure a data state metric 640 associated with one or more memory cell of the page of the memory device. This measurement can be the same or similar to a measurement made in order to estimate locations of bins with respect to block families after power on. In some embodiments, the data state metric can be any data state value associated with memory cells of the block family that would be capable of extrapolation to determine time. For example, the data state metric can be a lower tail, an upper tail, or a median of a level seven (L7) distribution (for TLCs), the valley of the level six (L6) or level seven (L7) distributions (for TLCs), or a shift in read voltage necessary to reproduce the same fail bit count experienced before power loss. The block family manager 113 can also compare a level of the data state metric to the temporal voltage shift (TVS) function 645 to estimate a time after program value of the memory cells. The TVS function is a function that describes how the data state metric varies as a function of time after program (TAP). The block manager manger 113 can then increment the timer value 632, restored from the memory device (or other NVM), based on the time after program value.

In yet another embodiment, the block family manager 113 stores not only the timer value 632 but also the fail bit count 636 to the memory device 130 (or other non-volatile memory (NVM)) in response to detecting an imminent power loss. The fail bit count 636 can be a number of read failures counted per bit within the block family at a specific read voltage before the memory sub-system 110 is powered down. In response to detecting a power on of the system, the block family manger 113 can further estimate a temporal voltage shift (TVS) value, within memory cells of the block family, that results in approximately the fail bit count within the block family. The block family manger 113 can estimate a time period the memory device 130 has been powered off based on the estimated TVS value, and increment the timer value 632, restored from the memory device 130 (or other NVM), by the time period. The timer value 632 that is restored to the timer 612 can then be more accurate having incorporated an estimate of the power off time period.

By continuously keeping track of power on time in addition to the extrapolation of power off time (using one of the data state metrics or a low power clock), the bock family manager 113 can generate a continuous timeline of each event that occurs within the memory sub-system 110. This information is directly helpful to define the timestamp when block boundaries or each page has been programmed within the memory device. Maintaining a continuous timestamp since the memory sub-system 110 is manufactured all the way to its end of life helps track the age of each byte of data written on within the memory sub-system 110 and useful to bucket pages and blocks into block families as discussed herein.

Figure 7:
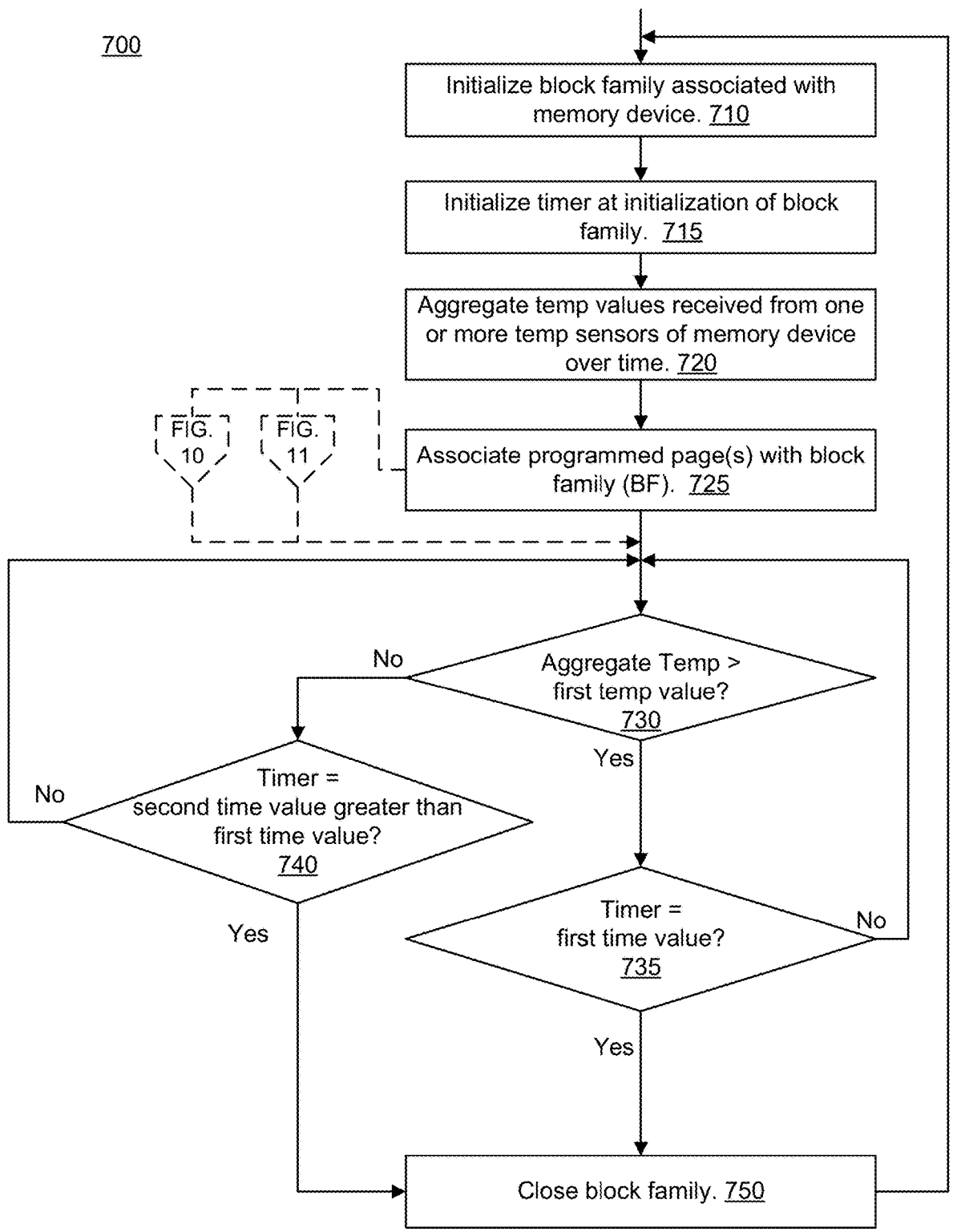
FIG. 7 is a flow diagram of an example method for determining, by a memory sub-system controller, open block family duration based on time and temperature, in accordance with some embodiments.

FIG. 7 is a flow diagram of an example method 700 for determining, by a memory sub-system controller, open block family duration based on time and temperature, in accordance with some embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 710, the processing logic initializes a block family associated with a memory device, such as the memory device 130 or other non-volatile device. At operation 715, the processing logic initializes a timer at initialization of the block family. This timer can be the timer 612 discussed in referenced to FIG. 6, and can be associated with a system clock. At operation 720, the processing logic can aggregate temperature values received from one or more temperature sensors of the memory device over time. The temperature being aggregated can be derived at some location of the memory sub-system 110, such as at the controller 115, a thermocouple, or at one or more of multiple dice of the memory device.

At operation 725, the processing logic, responsive to programming a page residing on the memory device, associates the block with the block family. In some embodiments, only a sub-part of a block is programmed (e.g., multiple pages), and thus that sub-part can be partitioned and the programmed partition associated with the block family. In other embodiments, multiple blocks are associated with the block family as programming proceeds. Further, in response to detecting an imminent power off of the memory sub-system, the processing logic can perform the process of either of FIG. 10 or FIG. 11, which will be discussed in detail.

At operation 730, the processing logic determining whether the aggregate temperature has reached a first temperature value. In response to the aggregate temperature being greater than a first temperature value, at operation 735, the processing logic determines whether the timer has reached a first time value. At operation 750, the processing logic closes the block family in response to the timer reaching a first time value. If the timer, at operation 735, has not reached the first time value, the processing logic loops back to operation 730.

If, at operation 730, the aggregate temperature is less or equal to the first temperature value, the processing logic can, at operation 740, determine whether the timer has reached a second time value that is greater than the first time value. If the timer has not reached the second time value, the processing logic can loop back to operation 730 and therefore continue to monitor for both an increase in aggregate temperature and passage of time on the timer. If, at operation 740, in response to the timer reaching the second time value, the processing logic can, at operation 750, close the block family. The processing logic can also assign a BF identifier to the closed block family.

Figure 8:
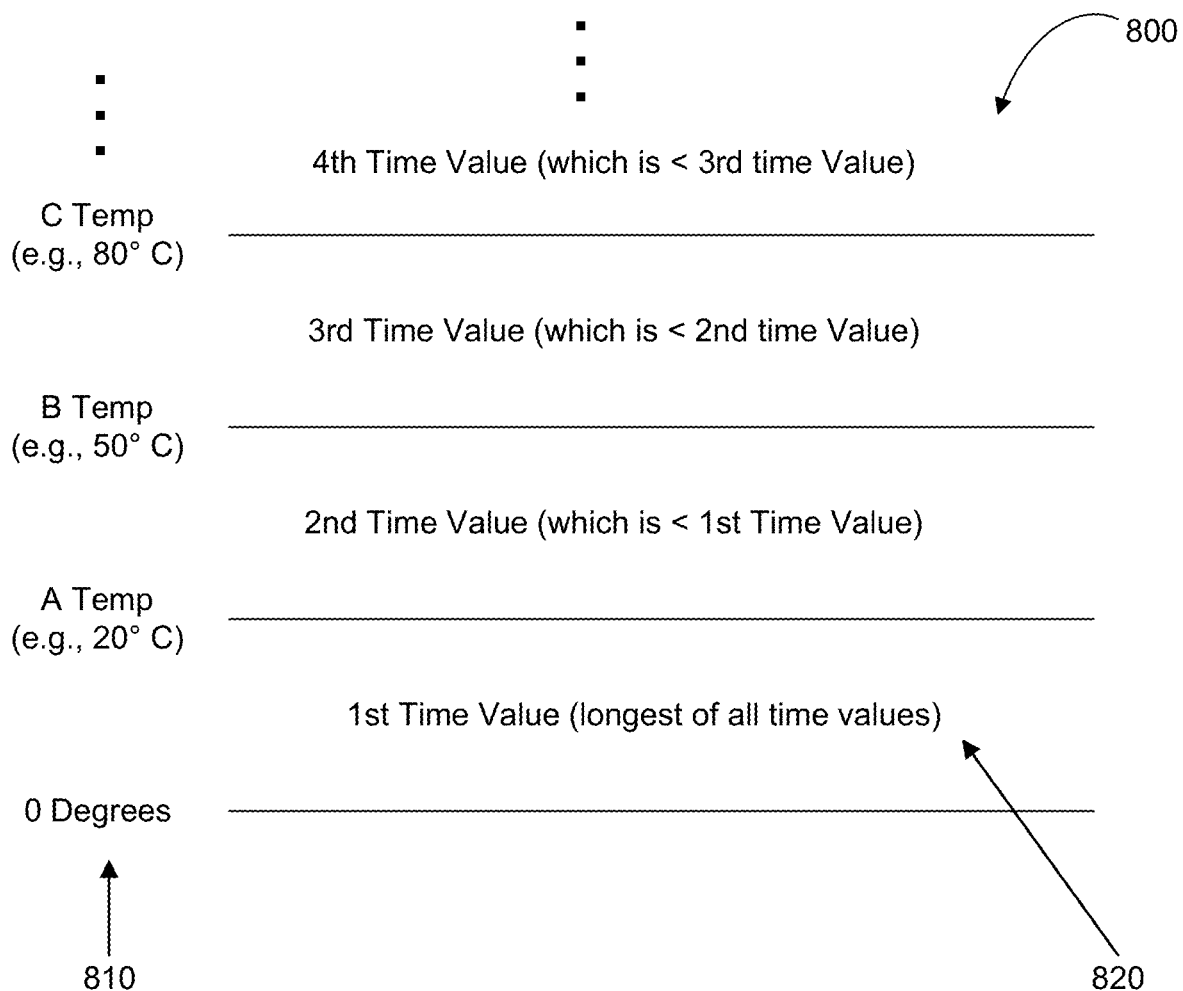
FIG. 8 is a graph illustrating open block family duration based on time and aggregate temperature, in accordance with various embodiments.

FIG. 8 is a graph 800 illustrating open block family duration based on time and aggregate temperature, in accordance with various embodiments. The graph 800 is an illustration of how the method 700 of FIG. 7 can be extended to an expanded set of aggregate temperature ranges 810. For example, numerous temperature ranges can be defined at increasingly higher aggregate temperatures, and each aggregate temperature range can be associated with a different time value (of a set of time values 820) that the timer 612 is to reach before closing a block family. Each time value of a higher aggregate temperature range is smaller than the time value for a lower aggregate temperature range.

For example, aggregate temperatures between zero and an A temperature (such as 20° C.) require the timer 612 to reach a first time value before closing a block family. The first time value can be the longest of the time-to-close values. Average temperatures between the A temperature and a B temperature (such as 50° C.) require the timer 612 to reach a second time value that is less than the first time value before closing a block family. Average temperatures between the B temperature and a C temperature (such as 80° C.) require the timer 612 to reach a third time value that is less than the second time value before closing the block family. And, aggregate temperatures greater than or equal to the C temperature require the timer 612 to reach a fourth time value that is less than the third time value before closing the block family.

This type of graduated scale of temperature versus time with which to define open block family duration is informed by FIG. 4. Accordingly, the aggregate temperatures and corresponding time values can be seen as examples and additional levels of granularity can be added to match up many more time values of the timer 612 to be met depending on differing ranges of aggregate temperature. Further, if a time value has not been met in a lower temperature range, but the aggregate temperature has increased sufficiently to have crossed into a higher aggregate temperature range, the block family manager 113 can check to determine if the value of timer 612 has already reached a time value associated with the higher aggregate temperature range (which would be lower than that of the lower aggregate temperature range). If the timer 612 has reached the time value associated with the higher aggregate temperature range, no additional waiting is required, and the block family manager 113 can close the block family. In this way, the increase of both time and aggregate temperature bring the open block family closer to closing.

Further, consider that the first time value of FIG. 7 is actually the second time value in FIG. 8. As an extension to the method 700, consider the aggregate temperature associated with the first time value is between the first temperature value and a second temperature value that is higher than the first temperature value. To apply this to FIG. 8, assume the first temperature value is 20° C. and the second temperature value is 50° C. Thus, under these assumptions, the block family manager 113 can close a new block family in response to the aggregate temperature being between the first temperature value and the second temperature value and the timer reaching the first time value. Further, the block family manager 113 can close the new block family in response to the aggregate temperature being greater than or equal to the second temperature value and the timer reaching a third time value that is less than the first time value. This process can be extended to require the aggregate temperature to be between the second temperature value and the third temperature value to apply the third time value.

Figure 9:
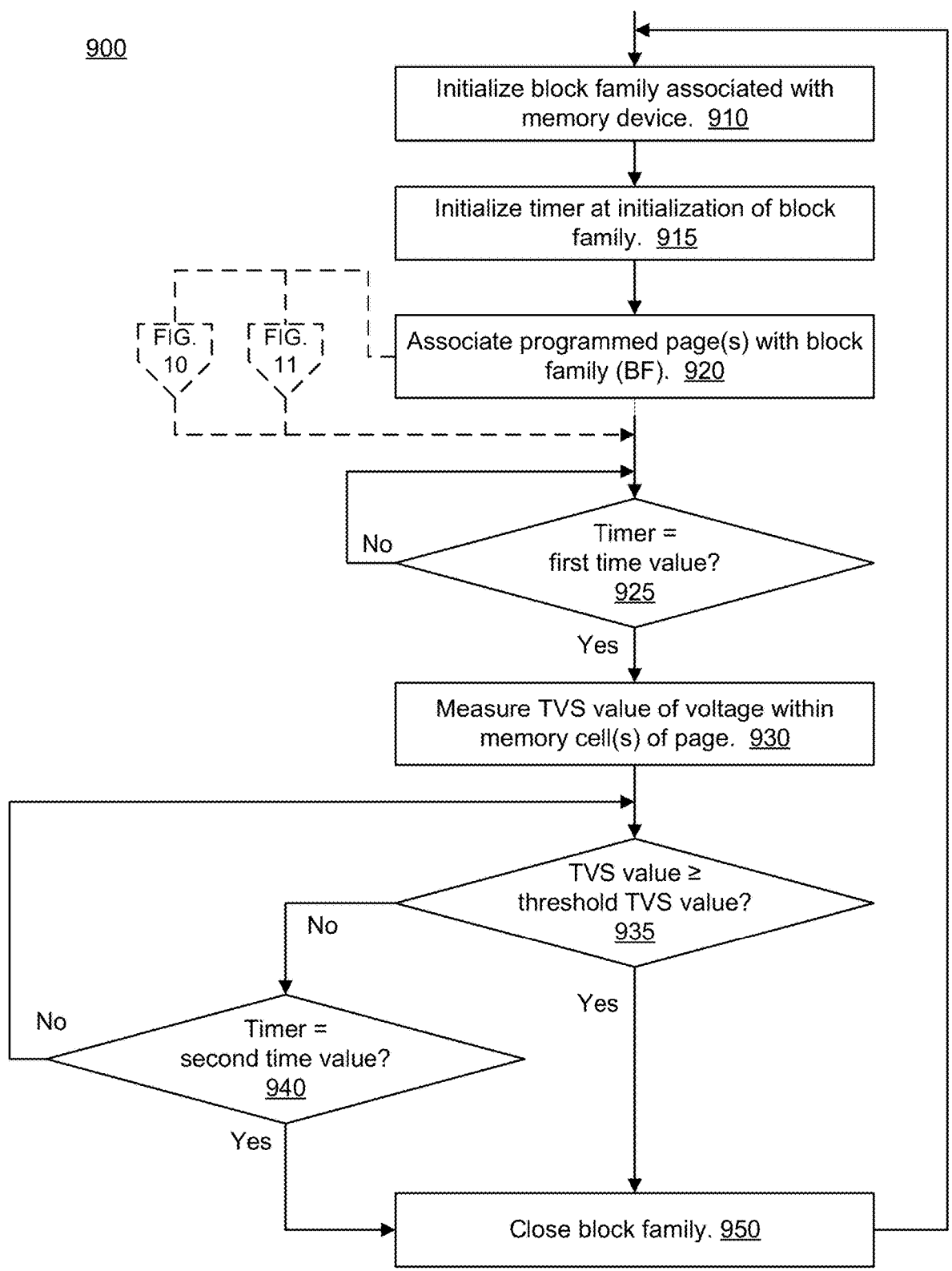
FIG. 9 is a flow diagram of an example method of determining, by a memory sub-system controller, open block family duration based on time and measured temporal voltage shift (TVS) in accordance with some embodiments.

FIG. 9 is a flow diagram of an example method 900 of determining, by a memory sub-system controller, open block family duration based on time and measured temporal voltage shift (TVS) in accordance with some embodiments. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic initializes a block family associated with a memory device. For example, the memory device can be the memory device 130. At operation 915, the processing logic initializes a timer associated with a system clock at initialization of the block family. This timer can be the timer 612 discussed in referenced to FIG. 6.

At operation 920, the processing logic, responsive to programming a page residing on the memory device, associates the block with the block family. In some embodiments, only a sub-part of a block is programmed (e.g., multiple pages), and thus that sub-part can be partitioned and the programmed partition associated with the block family. In other embodiments, multiple blocks are associated with the block family as programming proceeds. Further, in response to detecting an imminent power off of the memory sub-system, the processing logic can perform the process of either of FIG. 10 or FIG. 11, which will be discussed in detail.

At operation 925, the processing logic determines whether the timer 612 has reached a first time value. If not, the processing logic, at operation 925, continues to wait for the timer 612 until the first time value is reached. At operation 930, in response to the timer 612 reaching the first time value, the processing logic measures a temporal voltage shift (TVS) value of a voltage within one or more memory cell of the page (of the block family) in response to the timer reaching a first time value. As discussed, the TVS value can be an even more accurate value as compared to aggregate temperature, and thus an indication of when an open block family should be closed.

At operation 935, the processing logic determines whether the TVS value is greater than or equal to a threshold TVS value. In response to the TVS value being greater than or equal to the threshold TVS value, the processing logic, at operation 950, closes the block family. The processing logic can also assign a BF identifier to the closed block family.

If, at operation 935, the TVS value is less than the threshold TVS value, the processing logic determines, at operation 940, whether the timer 612 has reached a second time value that is greater than the first time value. In response to the timer 612 reaching the second time value, the processing logic, at operation 950, closes the block family. The processing logic can determine the second amount of time as a function of how close the measured TVS value is from reaching the threshold TVS value, as a set amount of time, or based on some other estimates based on the measured TVS value.

In alternative embodiments, the method 900 can incorporate one or more additional measurements of the TVS value of the block family after the second time value is reached and/or after subsequent time values are reached. If a subsequently measured TVS value is greater than or equal to the threshold TVS value, the processing logic can then close the block family. In this way, the passage of time requires TVS measurements, which can be the deciding factor to closing the block family, in lieu of time.

Figure 10:
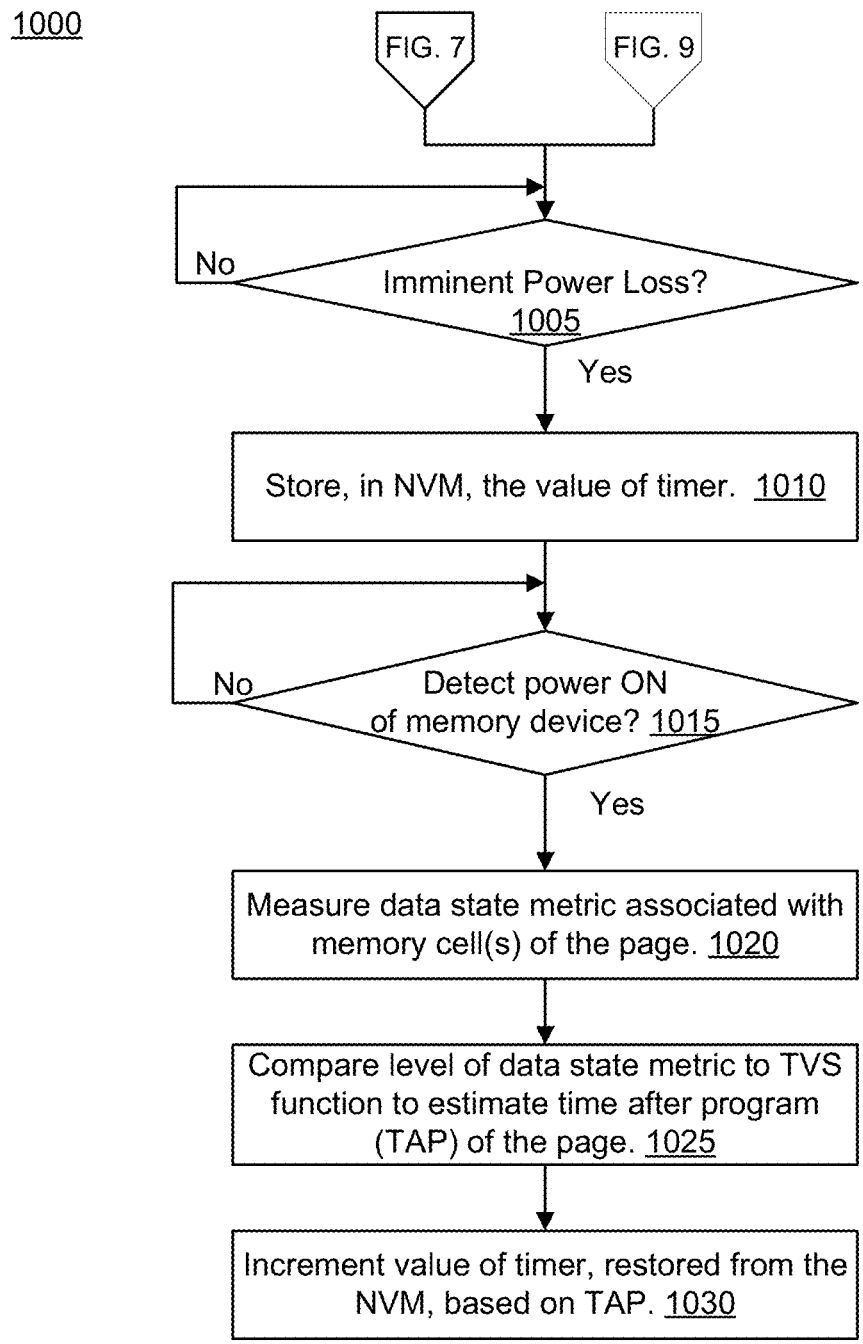
FIG. 10 is a flow diagram of an example method of estimating, by a memory sub-system controller, a device power off period in accordance with an embodiment.

FIG. 10 is a flow diagram of an example method 1000 of estimating, by a memory sub-system controller, a device power off period in accordance with an embodiment. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1005, the processing logic determines whether power loss is imminent in the memory sub-system 110, and thus the memory device is about to lose power as well. In response to detecting imminent power loss, at operation 1010, the processing logic stores, in non-volatile memory, a value of the timer 612. In one embodiment, the non-volatile memory is the memory device 130 or other NVM device.

At operation 1015, the processing logic determines whether the memory sub-system 110 has powered on, and thus whether the memory device has powered on as well. In response to the memory device powering on, the processing logic, at operation 1020, measures a data state metric associated with one or more memory cell of the page of the memory device. The data state metric can be any data state value associated with pages of the block family that would be capable of extrapolation to determine time. For example, the data state metric can be a lower tail, and upper tail, or a median of a level seven (L7) distribution, the valley of the level six (L6) or level seven (L7) distributions, or a shift in read voltage necessary to reproduce the same fail bit count experienced before losing power, the latter of which will be discussed with reference to FIG. 11.

At operation 1025, the processing logic compares a level of the data state metric to a temporal voltage shift function to estimate a time after program (TAP) value of the page. The TVS function is a function that describes how the data state metric varies as a function of time after program (TAP). At operation 1030, the processing logic increments the value of the timer 612, restored from the non-volatile memory, based on the time after program value. In this way, the value of the timer 612 is updated with an estimate of power off time and proceeds with a more accurate value against which BF closure will be determined as discussed herein.

Figure 11:
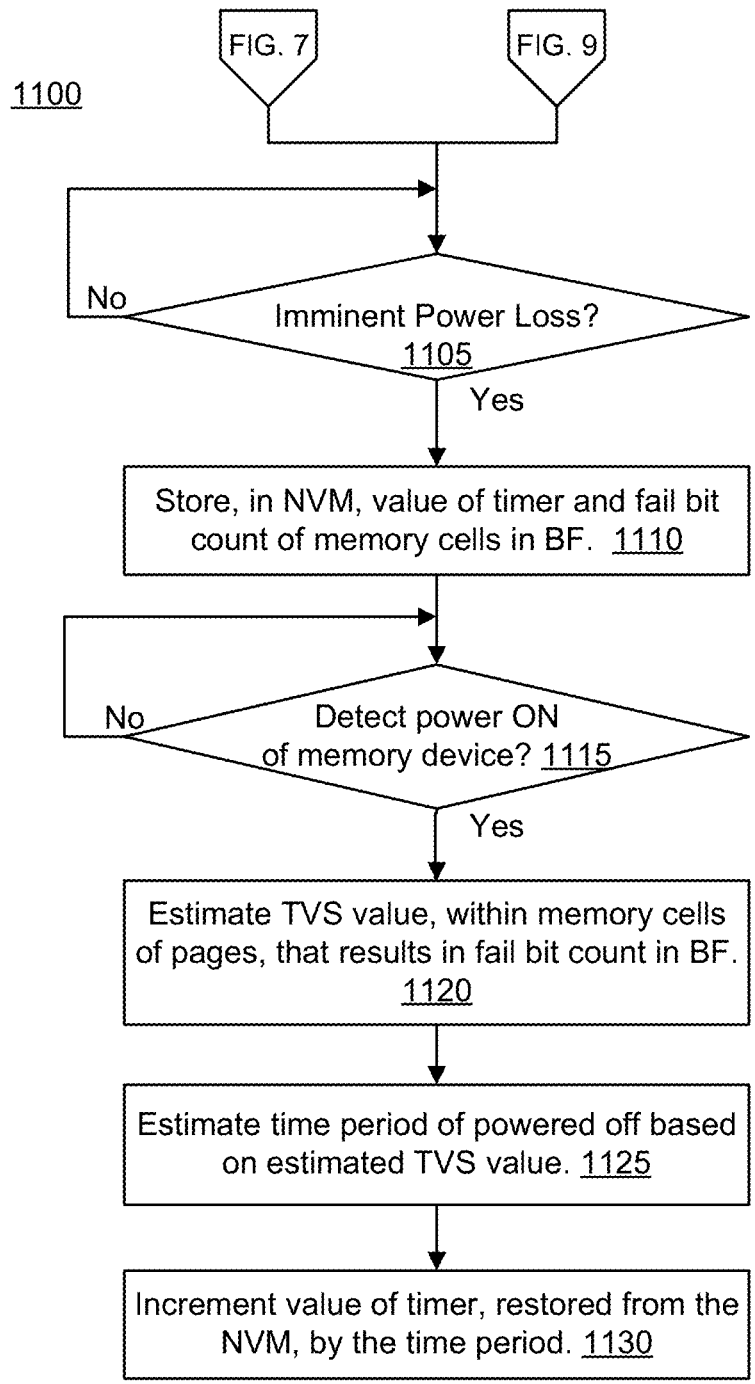
FIG. 11 is a flow diagram of an example method of estimating, by a memory sub-system controller, a device power off period in accordance with another embodiment.

FIG. 11 is a flow diagram of an example method 1100 of estimating, by a memory sub-system controller, a device power off period in accordance with another embodiment. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1105, the processing logic determines whether power loss is imminent in the memory sub-system 110, and thus the memory device is about to lose power as well. In response to detecting imminent power loss, at operation 1110, the processing logic stores, in the non-volatile memory, a value of the timer 612 and the fail bit count 636. The fail bit count 636 can be a value representing the number of failed read attempts of memory cells at the block family while the memory device was powered on and the block family still open. In one embodiment, the non-volatile memory is the memory device 130 or other NVM device.

At operation 1115, the processing logic determines whether the memory sub-system 110 has powered on, and thus whether the memory device has powered on as well. In response to the memory device powering on, the processing logic, at operation 1120, estimates a temporal voltage shift (TVS) value, within memory cells of the pages, that results in approximately the fail bit count within the block family.

At operation 1125, the processing logic estimates a time period the memory device has been powered off based on the estimated TVS value. This estimate can be based, for example, on wherein the estimate TVS value along the temporal voltage shift function 645 stored in the local memory 119. At operation 1130, the processing logic increments a value of the timer 612, restored from the non-volatile memory, by the time period. In this way, the value of the timer 612 is updated with an estimate of power off time and proceeds with a more accurate value against which BF closure will be determined as discussed herein.

Figure 12:
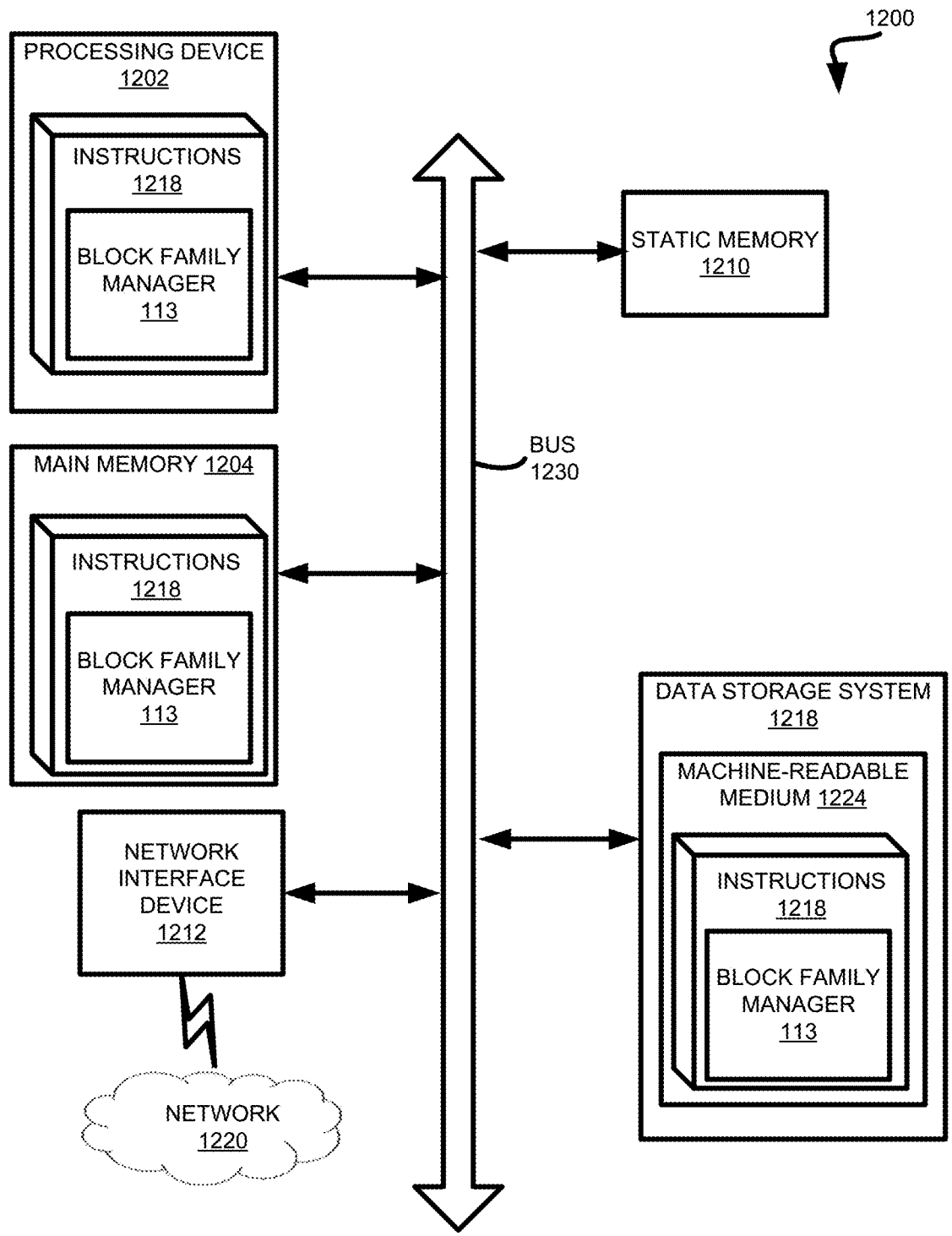
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a computer-readable medium) on which is stored one or more sets of instructions 1228 or software embodying any one or more of the methodologies or functions described herein. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1228 include instructions to implement functionality corresponding to the block family manager 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, the processing device to perform operations, comprising:
      initializing a block family associated with the memory device;
      initializing a timer at initialization of the block family;
      aggregating a plurality of temperature values received from one or more temperature sensors of the memory device over time to determine an aggregate temperature;
      responsive to programming a page residing on the memory device, associating the page with the block family;
      determining that the timer has reached a first time value in response to the aggregate temperature being greater than a first temperature value;
      closing the block family in response to the timer reaching the first time value;
      determining that the timer has reached a second time value, which is greater than the first time value, in response to the aggregate temperature being less than or equal to the first temperature value; and
      closing the block family in response to the timer reaching the second time value.

2. The system of claim 1, wherein the timer is associated with a system clock, and the operations further comprise, responsive to closing the block family, initializing a new block family.

3. The system of claim 2, wherein, for use of the first time value, the aggregate temperature is between the first temperature value and a second temperature value that is higher than the first temperature value, and wherein the operations further comprise:
   initializing the timer in response to initialization of the new block family;
   responsive to programming a second page residing on the memory device, associating the second page with the new block family;
   closing the new block family in response to the aggregate temperature being between the first temperature value and the second temperature value and the timer reaching the first time value; and
   closing the new block family in response to the aggregate temperature being greater than or equal to the second temperature value and the timer reaching a third time value that is less than the first time value.

4. The system of claim 1, wherein the operations further comprise:
   storing, in non-volatile memory, a value of the timer before powering down the system while the block family is still open;
   detecting a power on of the system;
   measuring a data state metric associated with one or more memory cell of the page of the memory device;
   comparing a level of the data state metric to a temporal voltage shift function to estimate a time after program value of the page; and
   incrementing the value of the timer, restored from the non-volatile memory, based on the time after program value.

5. The system of claim 1, wherein the operations further comprise:
   storing, in non-volatile memory, a value of the timer before powering down the system while the block family is still open;
   tracking, using a low-power clock, a time period the memory device is powered off;
   detecting a power on of the system; and
   incrementing the value of the timer, restored from the non-volatile memory, by the time period.

6. The system of claim 1, wherein the operations further comprise:
   storing, in non-volatile memory, a value of the timer and a fail bit count of pages within the block family before powering down the system while the block family is still open;
   detecting a power on of the system;
   estimating a temporal voltage shift (TVS) value, within memory cells of the pages, that results in approximately the fail bit count within the block family;
   estimating a time period the memory device has been powered off based on the estimated TVS value; and
   incrementing a value of the timer, restored from the non-volatile memory, by the time period.

7. The system of claim 1, wherein the operations further comprise, responsive to closing the block family, associating the block family with a first threshold voltage offset bin.

8. A method comprising:
initializing, by a processing device, a block family associated with a memory device;
initializing a timer at initialization of the block family;
aggregating a plurality of temperature values received from one or more temperature sensors of the memory device over time to determine an aggregate temperature;
responsive to programming a page residing on the memory device, associating the page with the block family;
determining that the timer has reached a first time value in response to the aggregate temperature being greater than a first temperature value;
closing, by the processing device, the block family in response to the timer reaching the first time value;
determining that the timer has reached a second time value, which is greater than the first time value, in response to the aggregate temperature being less than or equal to the first temperature value; and
closing, by the processing device, the block family in response to the timer reaching the second time value.

9. The method of claim 8, wherein the timer is associated with a system clock, the method further comprising, responsive to closing the block family, initializing a new block family.

10. The method of claim 9, wherein, for use of the first time value, the aggregate temperature is between the first temperature value and a second temperature value that is higher than the first temperature value, the method further comprising:
initializing the timer in response to initialization of the new block family;
closing the new block family in response to the timer reaching the first time value and the aggregate temperature being between the first temperature value and the second temperature value; and
closing the new block family when the timer reaches a third time value that is greater than the first time value and the aggregate temperature being greater than or equal to the second temperature value.

11. The method of claim 8, further comprising:
storing, in non-volatile memory, a value of the timer before powering down the memory device while the block family is still open;
detecting a power on of the memory device;
measuring a data state metric associated with one or more memory cell of the page of the memory device;
comparing a level of the data state metric to a temporal voltage shift function to estimate a time after program value of the page; and
incrementing the value of the timer, restored from the non-volatile memory, based on the time after program value.

12. The method of claim 8, further comprising:
storing, in non-volatile memory, a value of the timer before powering down the memory device while the block family is still open;
tracking, using a low-power clock, a time period the memory device is powered off;
detecting a power on of the memory device; and
incrementing the value of the timer, restored from the non-volatile memory, by the time period.

13. The method of claim 8, further comprising:
storing, in non-volatile memory, a value of the timer and a fail bit count of pages within the block family before powering down the memory device while the block family is still open;
detecting a power on of the memory device;
estimating a temporal voltage shift (TVS) value, within memory cells of the pages, that results in approximately the fail bit count within the block family;
estimating a time period the memory device has been powered off based on the estimated TVS value; and
incrementing a value of the timer, restored from the non-volatile memory, by the time period.

14. The method of claim 8, further comprising, responsive to closing the block family, associating the block family with a first threshold voltage offset bin.

15. A non-transitory computer-readable storage medium storing instructions, which when executed by a processing device of a memory sub-system, cause the processing device to perform operations comprising:
initializing a block family associated with a memory device;
initializing a timer at initialization of the block family;
aggregating a plurality of temperature values received from one or more temperature sensors of the memory device over time to determine an aggregate temperature;
responsive to programming a page residing on the memory device, associating the page with the block family;
determining that the timer has reached a first time value in response to the aggregate temperature being greater than a first temperature value;
closing the block family in response to the timer reaching the first time value;
determining that the timer has reached a second time value, which is greater than the first time value, in response to the aggregate temperature being less than or equal to the first temperature value; and
closing the block family in response to the timer reaching the second time value.

16. The non-transitory computer-readable storage medium of claim 15, wherein the timer is associated with a system clock, the operations further comprising, responsive to closing the block family, initializing a new block family.

17. The non-transitory computer-readable storage medium of claim 16, wherein, for use of the first time value, the aggregate temperature is between the first temperature value and a second temperature value that is higher than the first temperature value, the operations further comprising:
initializing the timer in response to initialization of the new block family;
closing the new block family in response to the timer reaching the first time value and the aggregate temperature being between the first temperature value and the second temperature value; and
closing the new block family when the timer reaches a third time value that is greater than the first time value and the aggregate temperature being greater than or equal to the second temperature value.

18. The non-transitory computer-readable storage medium of claim 15, wherein the operations further comprise:
storing, in non-volatile memory, a value of the timer before powering down the memory device while the block family is still open;
detecting a power on of the memory device;

measuring a data state metric associated with one or more memory cell of the page of the memory device;

comparing a level of the data state metric to a temporal voltage shift function to estimate a time after program value of the page; and incrementing the value of the timer, restored from the non-volatile memory, based on the time after program value.

19. The non-transitory computer-readable storage medium of claim 15, wherein the operations further comprise:

storing, in non-volatile memory, a value of the timer before powering down the memory device while the block family is still open;

tracking, using a low-power clock, a time period the memory device is powered off;

detecting a power on of the memory device; and incrementing the value of the timer, restored from the non-volatile memory, by the time period.

20. The non-transitory computer-readable storage medium of claim 15, wherein the operations further comprise:

storing, in non-volatile memory, a value of the timer and a fail bit count of pages within the block family before powering down the memory device while the block family is still open;

detecting a power on of the memory device;

estimating a temporal voltage shift (TVS) value, within memory cells of the pages, that results in approximately the fail bit count within the block family;

estimating a time period the memory device has been powered off based on the estimated TVS value; and incrementing a value of the timer, restored from the non-volatile memory, by the time period.

* * * * *